(12) United States Patent
Suzuki et al.

(10) Patent No.: US 11,536,743 B2
(45) Date of Patent: Dec. 27, 2022

(54) KELVIN CONTACT FOR INSPECTION, KELVIN SOCKET FOR INSPECTION, AND METHOD OF MANUFACTURING KELVIN CONTACT FOR INSPECTION

(71) Applicant: Yamaichi Electronics Co., Ltd., Tokyo (JP)

(72) Inventors: Katsumi Suzuki, Tokyo (JP); Akira Genma, Tokyo (JP); Tsuyoshi Matsumoto, Tokyo (JP); Tetsuya Kubota, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 17/467,134

(22) Filed: Sep. 3, 2021

(65) Prior Publication Data

US 2022/0074969 A1     Mar. 10, 2022

(30) Foreign Application Priority Data

Sep. 8, 2020   (JP) .............................. JP2020-150608

(51) Int. Cl.
| | |
|---|---|
| *G01R 1/04* | (2006.01) |
| *G01R 1/067* | (2006.01) |
| *G01R 1/073* | (2006.01) |
| *G01R 31/20* | (2006.01) |
| *G01R 31/28* | (2006.01) |

(52) U.S. Cl.
CPC .................................. *G01R 1/0441* (2013.01)

(58) Field of Classification Search
CPC .......... G01R 1/04; G01R 1/067; G01R 1/073; G01R 31/02; G01R 31/20; G01R 31/28
See application file for complete search history.

(56) References Cited

U.S. PATENT DOCUMENTS

2020/0319245 A1*  10/2020  Osato ................... G01R 1/0466

FOREIGN PATENT DOCUMENTS

| JP | 2003-123874 A | 4/2003 |
|---|---|---|
| JP | 2004-111056 A | 4/2004 |
| JP | 2005-310762 A | 11/2005 |
| JP | 2005-326307 A | 11/2005 |
| JP | 4137563 B | 8/2008 |
| JP | 5168671 B | 3/2013 |
| JP | 6362507 B | 7/2018 |

* cited by examiner

*Primary Examiner* — Neel D Shah
(74) *Attorney, Agent, or Firm* — Hamilton, Brook, Smith & Reynolds, P.C.

(57) ABSTRACT

Provided is a Kelvin contact for inspection in which contacts and an insulating layer are less likely to be shifted relative to each other even after repeatedly performed Kelvin inspection. The Kelvin contact for inspection includes: a first contact having an upper contact point that comes into contact with one electrode terminal of an IC device and a lower contact point that comes into contact with an electrode pad of a substrate for inspection; and a second contact having an upper contact point that comes into contact with the one electrode terminal and the lower contact point that comes into contact with an electrode pad of the substrate for inspection. The first and second contacts are adjacently arranged to contact with the same one electrode terminal and provided with an insulating layer surrounding the entire main body area except upper and lower contact point areas including the upper and lower contact points, respectively.

8 Claims, 18 Drawing Sheets

KELVIN CONTACT FOR INSPECTION, KELVIN SOCKET FOR INSPECTION, AND METHOD OF MANUFACTURING KELVIN CONTACT FOR INSPECTION

RELATED APPLICATIONS

This application claims priority under 35 U.S.C. § 119 or 365 to Japanese Patent Application No. 2020-150608, filed Sep. 8, 2020. The entire teachings of the above application is incorporated herein by reference.

BACKGROUND

1. Field of the Invention

The present invention relates to a Kelvin contact for inspection and a Kelvin socket for inspection used for performing Kelvin inspection on an electronic component and a method of manufacturing the Kelvin contact for inspection.

2. Description of Related Art

Kelvin inspection, which is to perform inspection by contacting two contacts to one lead terminal of a semiconductor package (electronic component) such as a Small Outline Package (SOP) or a Quad Flat Package (QFP) at the same time, is performed in a related art (for example, Japanese Patent No. 4137563).

Japanese Patent No. 4137563 realizes electrical insulation between a pair of contacts by interposing an insulating sheet between the pair of contacts. The contacts and the insulating sheet are fixed to each other by lock pins inserted through a plurality of through holes formed in the contacts and the insulating sheet.

Japanese Patent No. 4137563 is an example of the related art.

In Japanese Patent No. 4137563, however, there is a problem of complex manufacturing steps due to a step of interposing an insulating sheet, a step of inserting a plurality of lock pins, and the like and a problem of an increased number of components.

Further, although the contact pins and the insulating sheet are fixed by lock pins, repeatedly performed Kelvin inspection may cause deformation of through holes through which the lock pins are inserted and accordingly the contact pins and the insulating sheet may be shifted relative to each other. If the contact pins and the insulating sheet are shifted relative to each other, the contacts may move beyond the insulating sheet and come into electrical contact with each other.

The present invention has been made in view of such circumstances and intends to provide a Kelvin contact for inspection and a Kelvin socket for inspection in which contacts and an insulating layer are less likely to be shifted relative to each other even after Kelvin inspection is repeatedly performed and provide a method of manufacturing the Kelvin contact for inspection.

SUMMARY

To solve the above problems, a Kelvin contact for inspection according to one aspect of the present invention includes: a first contact having one end that comes into contact with one electrode terminal of an electronic component and the other end that comes into contact with a substrate electrode of a substrate for inspection; and a second contact having one end that comes into contact with the one electrode terminal and the other end that comes into contact with a substrate electrode of the substrate for inspection. The first contact and the second contact are arranged adjacent to each other so as to be able to contact with the same one electrode terminal. At least one of the first contact and the second contact is provided with an insulating layer surrounding at least a part of a main body area except for one end area including the one end and the other end area including the other end.

Provided is a Kelvin contact for inspection used for performing inspection by causing both two contacts (the first contact and the second contact) to come into contact with one electrode terminal of an electronic component.

One end of each of the contacts comes into electrical contact with the electrode terminal, and the other end of each of the contacts comes into electrical contact with a substrate electrode of a substrate for inspection.

At least one of the two contacts is provided with an insulating layer surrounding at least a part of the main body area except for the area including one end and the area including the other end. Since the insulating layer is provided so as to surround at least a part of the main body area, the insulating layer and the contacts surrounded by the insulating layer are less likely to be shifted relative to each other. Therefore, even if two adjacent contacts are shifted relative to each other when the contacts are displaced, since the insulating layer and the contacts surrounded by the insulating layer are less likely to be shifted from each other, the insulating layer is ensured to be located between the two contacts, and it can be avoided that the two contacts come into electrical contact with each other beyond the insulating layer.

As the insulating layer, a polyimide coating or the like may be preferably used.

Furthermore, in the Kelvin contact for inspection according to one aspect of the present invention, the insulating layer is provided over the entire main body area.

Since the insulating layer is provided over the entire main body area except for the area including one end and the area including the other end of the contact, the likelihood of a shift of the insulating layer relative to the contacts can be further avoided, and electrical contact between the two contacts can be more reliably avoided.

Furthermore, in the Kelvin contact for inspection according to one aspect of the present invention, the insulating layer is provided on both the first contact and the second contact.

Since insulating layers are provided to both the contacts, insulation can be more reliably ensured.

Furthermore, in the Kelvin socket for inspection according to one aspect of the present invention includes: the Kelvin contact for inspection according to any one of the above; and a contact housing that accommodates the Kelvin contact for inspection.

A Kelvin socket for inspection is configured when any of the Kelvin contact for inspections described above is accommodated in a contact housing. The Kelvin socket for inspection is mounted on the substrate for inspection. When inspected, an electronic component is set so that the electrode terminals thereof are in electrical contact with the Kelvin contact for inspections provided on the Kelvin socket for inspection.

Furthermore, in the Kelvin socket for inspection according to one aspect of the present invention, an insulating partition plate is provided between one pair of contacts formed of the first contact and the second contact and another pair of contacts adjacent to the one pair of contacts.

By providing an insulating partition plate between adjacent pairs of contacts, it is possible to further ensure the insulation between the adjacent pairs of contacts.

Note that it is also possible to ensure insulation via a space by omitting the partition plate.

Furthermore, in the Kelvin socket for inspection according to one aspect of the present invention, the first contact and/or the second contact are/is replaceable with respect to the contact housing.

The contacts are configured to be replaceable. Accordingly, if a failure occurs in a contact, it is possible to continue inspection by replacing only the contact without replacing the whole socket.

A method of manufacturing a Kelvin contact for inspection according to one aspect of the present invention is a method of manufacturing a Kelvin contact for inspection that includes a first contact having one end that comes into contact with one electrode terminal of an electronic component and the other end that comes into contact with a substrate electrode of a substrate for inspection, and a second contact having one end that comes into contact with the one electrode terminal and the other end that comes into contact with a substrate electrode of the substrate for inspection, the first contact and the second contact are arranged adjacent to each other so as to be able to contact with the same one electrode terminal, and at least one of the first contact and the second contact is provided with an insulating layer surrounding at least a part of a main body area except for one end area including the one end and the other end area including the other end. The method includes: after masking the one end area and the other end area of the first contact and/or the second contact, forming the insulating layer on the first contact and/or the second contact.

By forming the insulating layer after masking one end area and the other end area, it is possible to form one end and the other end of the contact as an electrical contact point.

A method of manufacturing a Kelvin contact for inspection according to one aspect of the present invention is a method of manufacturing a Kelvin contact for inspection that includes a first contact having one end that comes into contact with one electrode terminal of an electronic component and the other end that comes into contact with a substrate electrode of a substrate for inspection, and a second contact having one end that comes into contact with the one electrode terminal and the other end that comes into contact with a substrate electrode of the substrate for inspection, the first contact and the second contact are arranged adjacent to each other so as to be able to contact with the same one electrode terminal, and at least one of the first contact and the second contact is provided with an insulating layer surrounding at least a part of a main body area except for one end area including the one end and the other end area including the other end. The method includes: after forming the insulating layer over the entirety of the first contact and/or the second contact, removing the insulating layer formed on the one end area and the other end area of the first contact and/or the second contact by using laser.

By removing one end area and the other end area by using laser after forming an insulating layer over the entire contact, it is possible to form one end and the other end of the contacts as an electrical contact point.

Since an insulating layer surrounding contacts is provided, the contacts and the insulating layer are less likely to be shifted relative to each other. Accordingly, stable Kelvin inspection can be performed even after Kelvin inspection is repeatedly performed.

Figure 1:
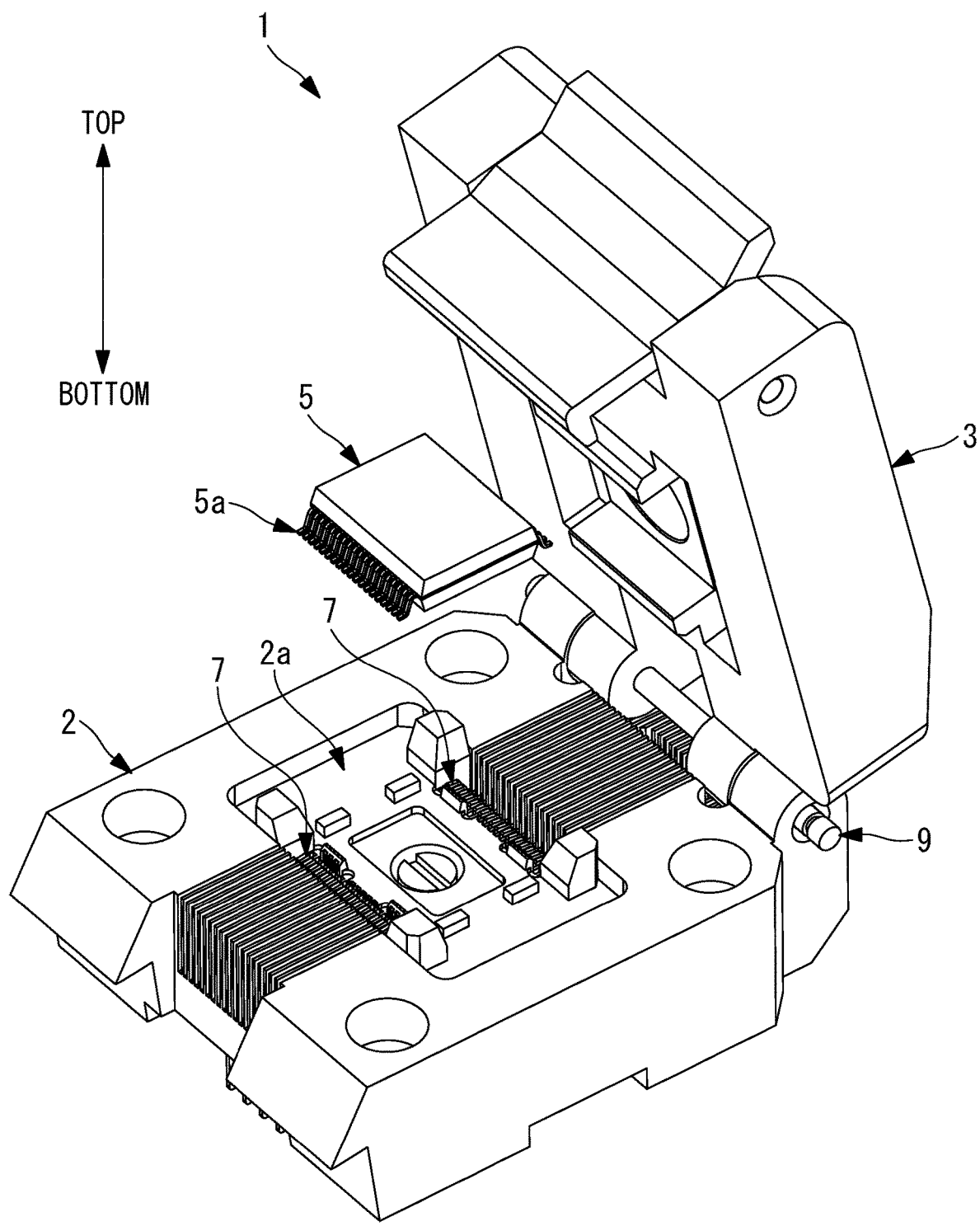
FIG. 1 is a perspective view illustrating an IC socket according to one embodiment of the present invention.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

One embodiment according to the present invention will be described below with reference to the drawings.

FIG. 1 illustrates an IC socket (Kelvin socket for inspection) 1 according to the present embodiment.

The IC socket 1 performs Kelvin inspection of an IC device (electronic component) 5. The IC socket 1 has a rectangular parallelepiped shape having substantially a square planar shape when viewed in plan view and has a base 2 and a cover 3 that is opened and closed with respect to the base 2. Note that the vertical (upper/lower) direction as used in the present embodiment means the vertical (upper/lower) direction illustrated in FIG. 1, the base 2 and the cover 3 are in a positional relationship such that the base 2 is located under the cover 3 and the cover 3 covers the upper face of the base 2 in a closed state. Note that FIG. 1 illustrates the open state where the cover 3 is opened with respect to the base 2.

A receiving recess 2a in which the IC device 5 is received during Kelvin inspection is formed in the middle of the base 2. The IC device 5 is inserted in and removed from the receiving recess 2a by using a gripping device such as a robot hand.

The IC device 5 is a surface-mounting type IC package in the embodiment illustrated in FIG. 1 and is a Small Outline Package (SOP). Note that, without being limited to the SOP, an IC package such as a Quad Flat Package (QFP), a Small Outline Non-leaded (SON), a Quad Flat Non-leaded (QFN), or the like may be used.

A plurality of electrode terminals 5a are provided in parallel in predetermined intervals on both sides of the IC device 5.

A plurality of contacts 7 are provided to the base 2 such that respective one ends (the upper contact point 7a described later: see FIG. 2) are exposed inside the receiving recess 2a. The contacts 7 are provided to positions corresponding to the electrode terminals 5a of the IC device 5.

The IC socket 1 is intended for Kelvin inspection, and two contacts 7 are arranged for one electrode terminal 5a so as to be able to contact with the electrode terminal 5a. The contacts 7 conduct the IC device 5 and a substrate for inspection 10 (see FIG. 2) to each other during inspection.

The cover 3 is pivotably coupled to the base 2 via a hinge 9. The cover 3 is closed with respect to the base 2 during inspection and opened with respect to the base 2 after the end of the inspection or in attachment and removal of the IC device 5.

Figure 2:
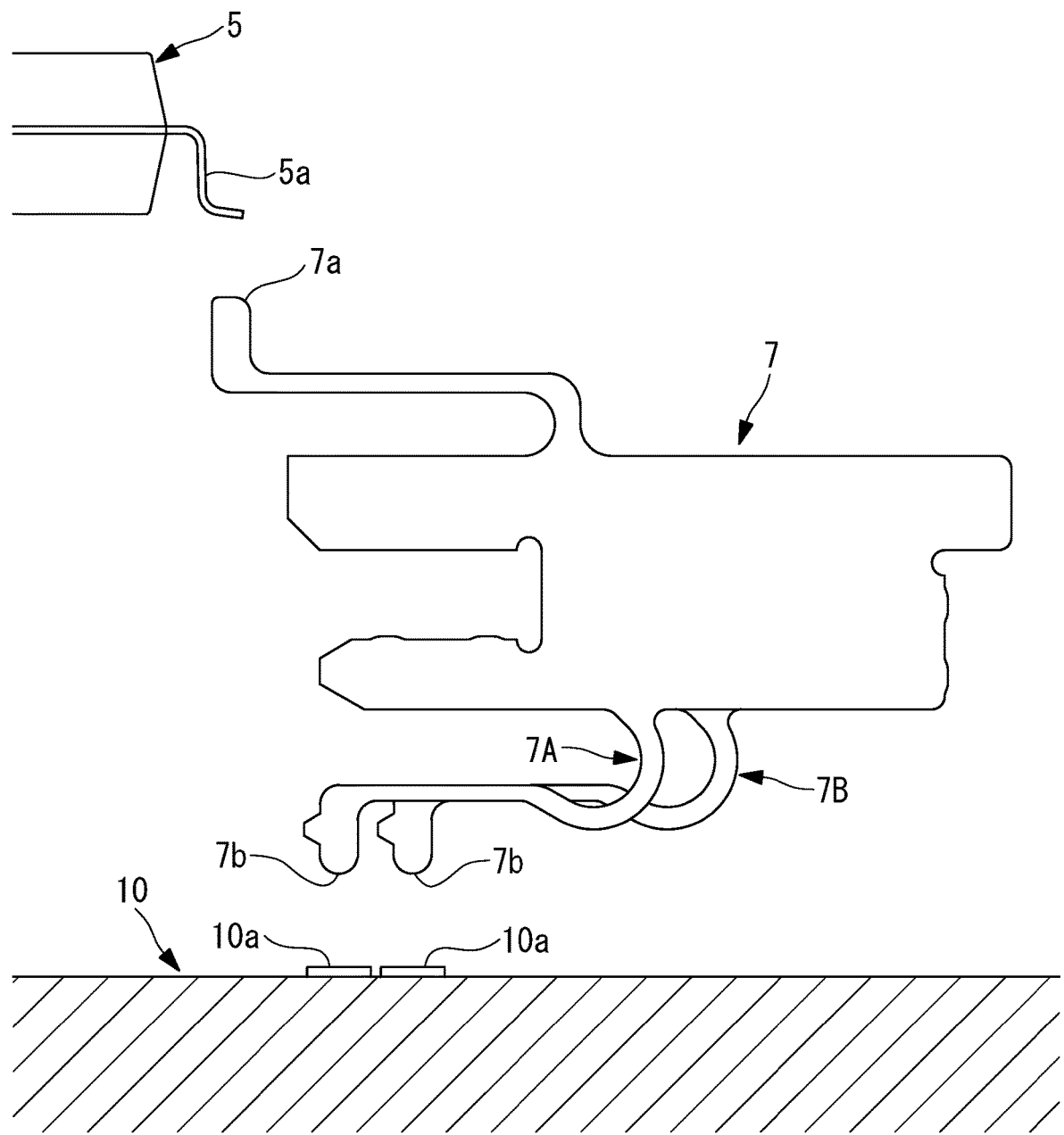
FIG. 2 is a front view illustrating a positional relationship between a contact, an IC device, and a substrate for inspection according to one embodiment of the present invention.

FIG. 2 illustrates the positional relationship between the contacts 7, the IC device 5, and the substrate for inspection 10. The substrate for inspection 10, the contacts 7, and the IC device 5 are located in this order from the bottom.

During inspection, each upper contact point (one end) 7a of the contacts 7 is electrically contacted with each electrode terminal 5a of the IC device 5, and the lower contact point (the other end) 7b of the contacts 7 is electrically contacted with each electrode pad (substrate electrode) 10a of the substrate for inspection 10.

Two contacts 7 are paired, and FIG. 2 illustrates a first contact 7A in the front and a second contact 7B in the back. The only difference between the first contact 7A and the second contact 7B is in the position of the lower contact point 7b, and the remaining shapes are the same. Therefore, description will be provided below with simple denotation of "contact 7" when it is not required to distinguish the first contact 7A and the second contact 7B from each other for description.

Figure 3:
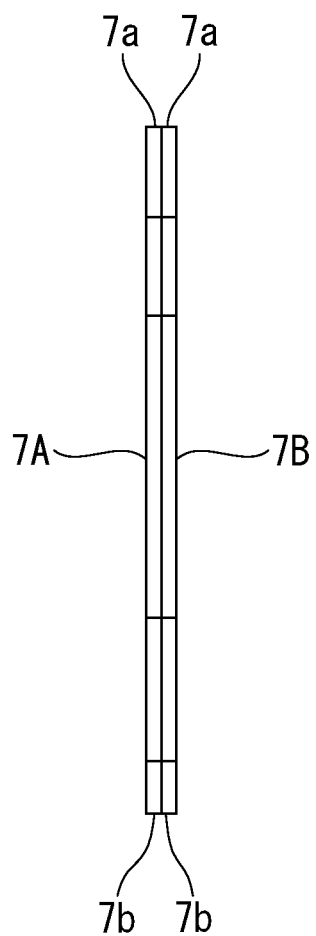
FIG. 3 is a side view illustrating a pair of contacts of FIG. 2.
Figure 4:
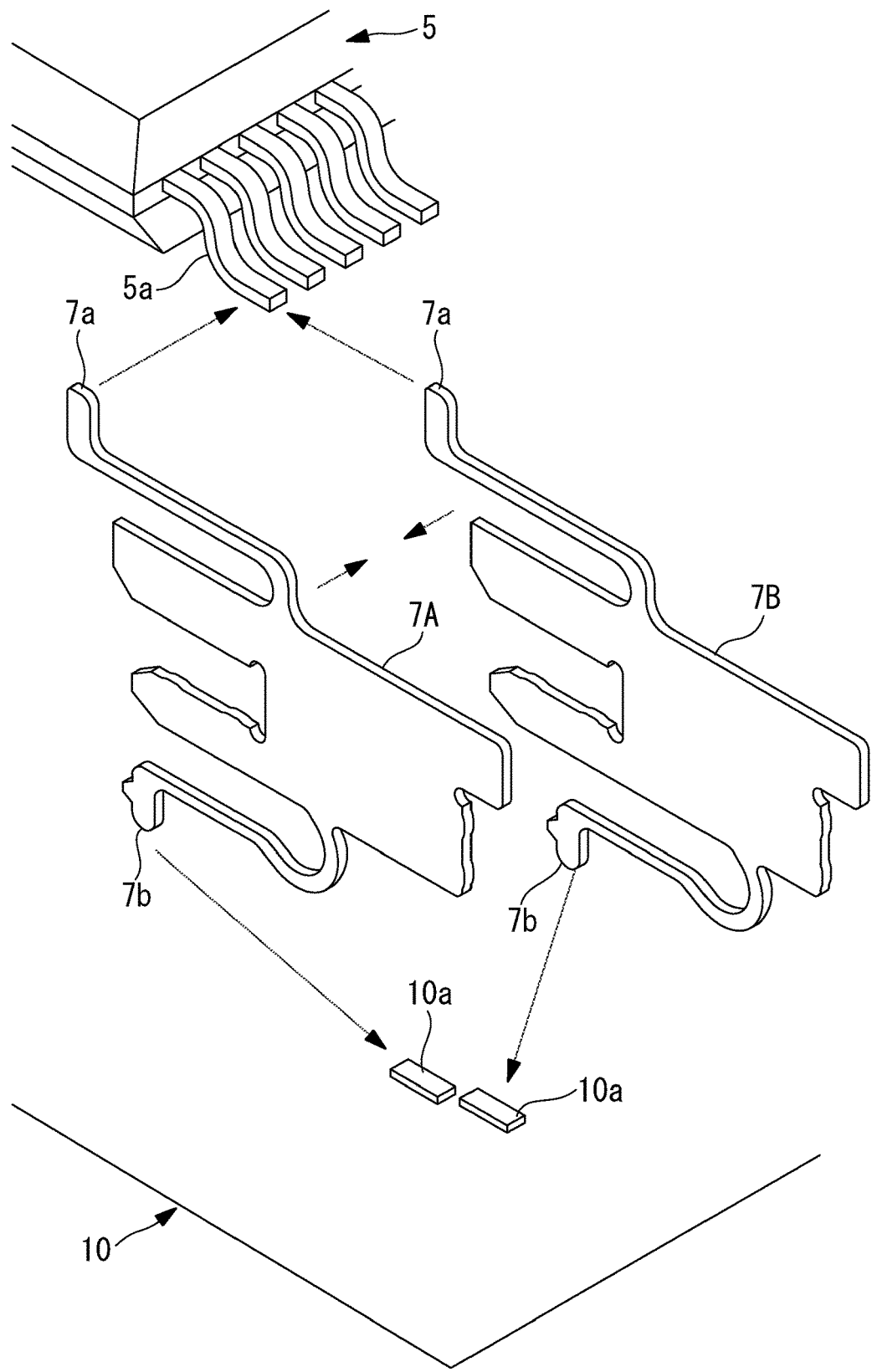
FIG. 4 is an exploded perspective view illustrating a positional relationship between the contacts and the IC device of FIG. 2.

As illustrated in FIG. 3 in side view, each contact 7 has a plate shape, and the two contacts 7A and 7B are paired as already described. As illustrated in FIG. 4, the upper contact points 7a of the pair of contacts 7A and 7B are connected to one electrode terminal 5a of the IC device 5 at the same time. The lower contact points 7b of the contacts 7A and 7B are connected to different electrode pads 10a, respectively.

Figure 5:
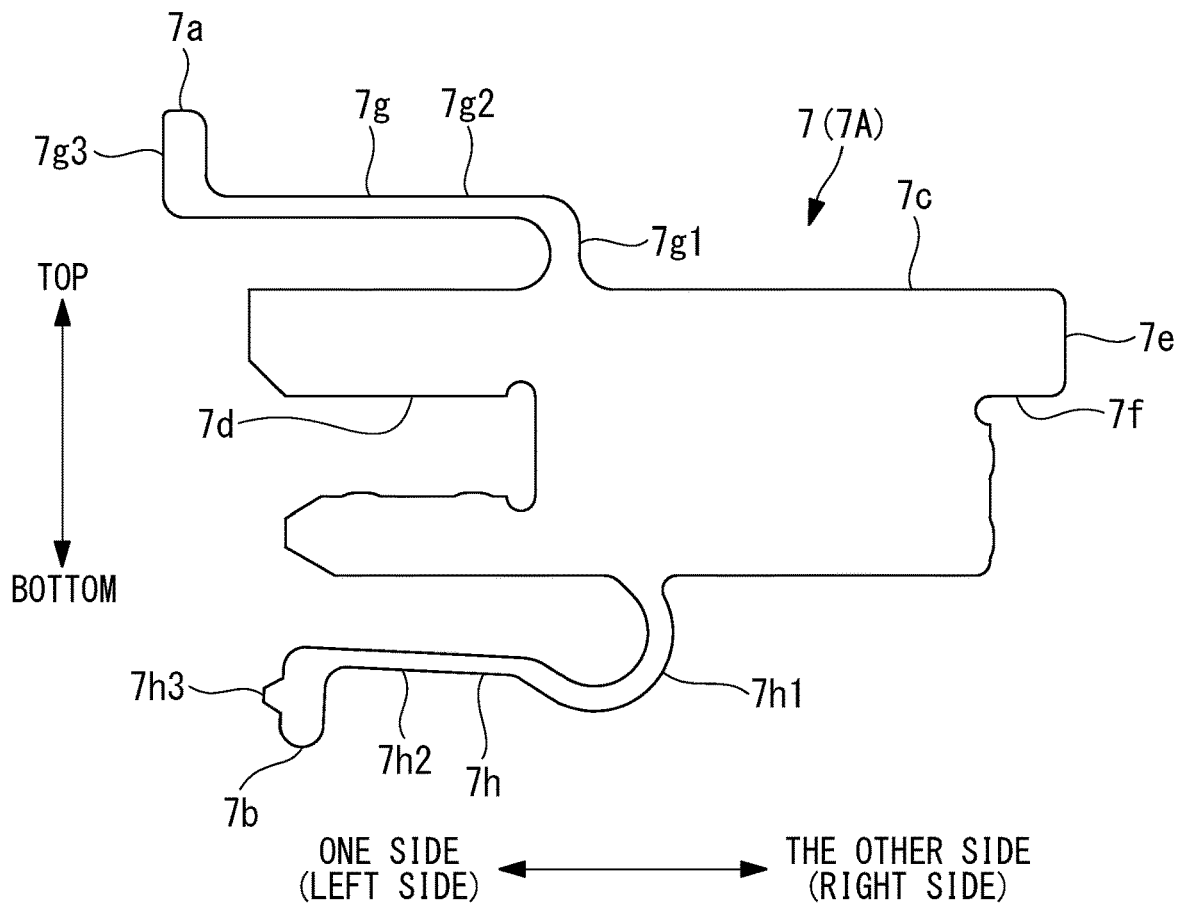
FIG. 5 is a front view illustrating the contact of FIG. 2.

FIG. 5 illustrates a front view of the contact 7. FIG. 5 illustrates the first contact 7A that is one of the paired contacts. The contact 7 has a plate shape as already described, and plating is applied thereto after a base material is cut out by wire cutting, for example. As the base material, beryllium copper is used, for example, and as the plating, gold plating is used, for example.

The contact 7 has an intermediate part 7c in the middle, the upper contact point 7a in the upper end, and the lower contact point 7b in the lower end. The intermediate part 7c has substantially a rectangular shape extending horizontally, and a rectangular groove 7d formed inward is formed on one side (the left side in FIG. 5). A recess 7f cut out downward to the lower end with a protrusion 7e on the top side being left is formed on the other side (the right side in FIG. 5) of the intermediate part 7c.

Figure 6:
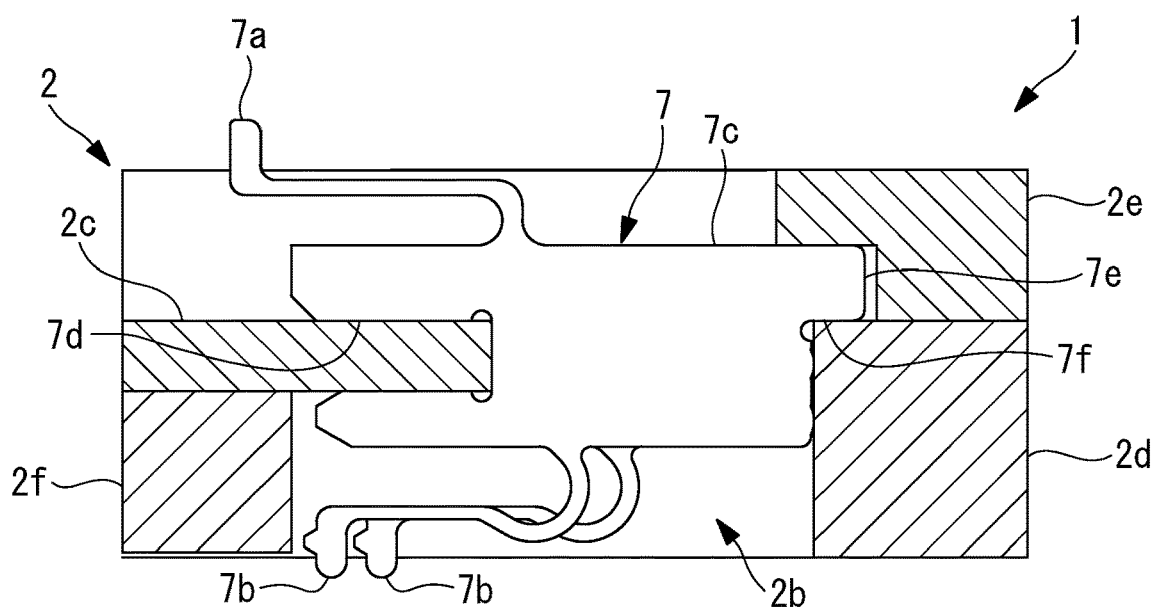
FIG. 6 is a vertical sectional view illustrating a contact provided in a contact housing of the IC socket.

As illustrated in FIG. 6, the contact 7 is accommodated in a contact housing 2b of the base 2 of the IC socket 1. In this state, one rectangular end of a fitting block 2c is fitted into the groove 7d of the contact 7. The fitting block 2c is fixed to the upper part of the inner wall block 2f forming a part of the inner wall of the base 2 of the IC socket 1. The recess 7f of the contact 7 is engaged with the shoulder of an engagement block 2d. The protrusion 7e of the contact 7 is latched from the above and the side by a latching block 2e attached to the upper part of the engagement block 2d. In such a way, the intermediate part 7c of the contact 7 is fixed and positioned inside the contact housing 2b by the fitting block 2c, the engagement block 2d, and the latching block 2e.

As illustrated in FIG. 5, an upper lever 7g is connected to the upper part of the intermediate part 7c of the contact 7. The upper lever 7g has a base end 7g1 erected upward from the upper part of the intermediate part 7c, an arm section 7g2 connected to the base end 7g1, bent at substantially a right angle, and extending in the side direction (to the left in FIG. 5), and a tip 7g3 connected to the arm section 7g2, bent at substantially a right angle, and extending upward. The upper contact point 7a is provided at the upper end of the tip 7g3.

A lower lever 7h is connected to the lower part of the intermediate part 7c of the contact 7. The lower lever 7h has an arc section 7h1 extending downward from the lower part of the intermediate part 7c and curved in substantially an arc shape to the side direction (to the left in FIG. 5), an arm section 7h2 connected to the arc section 7h1 and extending straight in the side direction (to the left in FIG. 5), and a tip 7h3 connected to the arm section 7h2, bent at substantially a right angle, and extending downward. The lower contact point 7b is provided to the lower end of the tip 7h3.

An insulating layer is formed on the outer surface of the contact 7 over the entire main body area except for an upper contact point area including the upper contact point 7a (one end area) and a lower contact point area including the lower contact points 7b (the lower end area). That is, the insulating layer covers the contact 7 so as to surround the entire circumference of the contact 7 (except for the upper contact point area and the lower contact point area). Specifically, the insulating layer is formed not only over the entirety (the front and back surfaces and both the side surfaces) of the intermediate part 7c of the contact 7 but also over the entirety (the front and back surfaces and both the side surfaces) of the upper lever 7g except for the upper contact point area and over the entirety (the front and back surfaces and both the side surfaces) of the lower lever 7h except for the lower contact point area.

As the insulating layer, a resin-based material is used, for example, polyimide is preferably used. A resin material other than polyimide may be acrylic polymer, epoxy resin, prepreg, or the like.

Figure 7A:
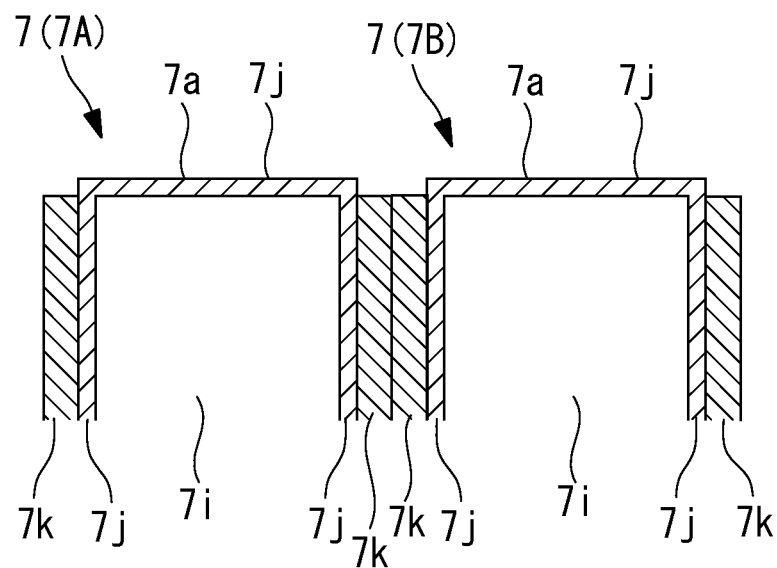
FIG. 7A is a partial enlarged vertical sectional view illustrating a part around the upper contact points of the contacts.

As illustrated in FIG. 7A, each upper contact point area including the upper contact point 7a is formed such that the upper end face of a plating layer 7j (for example, a gold plating layer) formed on a base material 7i (for example, beryllium copper) is exposed. Each area under the upper end face on which the upper contact point 7a is formed is covered with an insulating layer 7k. The position of the lower end of the upper contact point area in which the plating layer 7j is exposed (the upper end of the insulating layer 7k) is at about one time the thickness of the plating layer 7j, which is, for example, less than or equal to the thickness of the base material 7i, from the upper end of the upper contact point 7a.

Figure 7B:
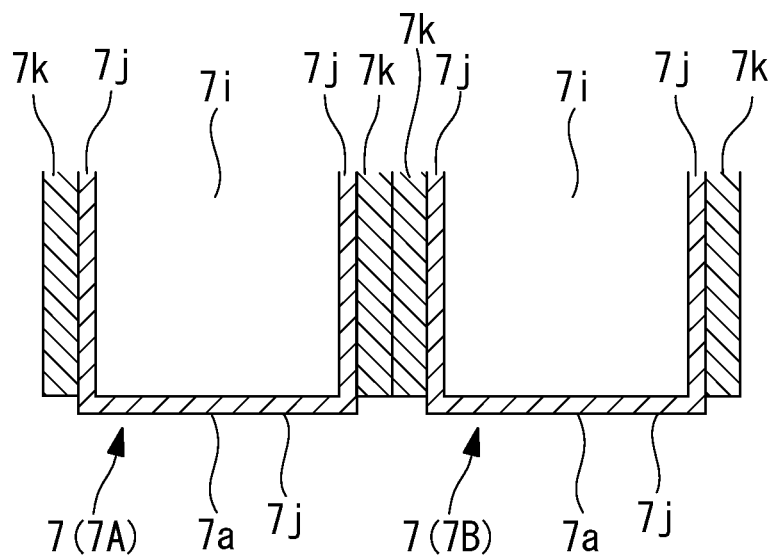
FIG. 7B is a partial enlarged vertical sectional view illustrating a part around the lower contact points of the contacts.

As illustrated in FIG. 7B, each lower contact point area including the lower contact point 7b is formed such that the lower end face of the plating layer 7j (for example, a gold plating layer) formed on the base material 7i (for example, beryllium copper) is exposed. Each area above the lower end face on which the lower contact point 7b is formed is covered with the insulating layer 7k. The position of the upper end of the lower contact point area in which the plating layer 7j is exposed (the lower end of the insulating layer) is at about one time the thickness of the plating layer 7j, which is, for example, less than or equal to the thickness of the base material 7i, from the lower end of the lower contact point 7b.

Figure 8:
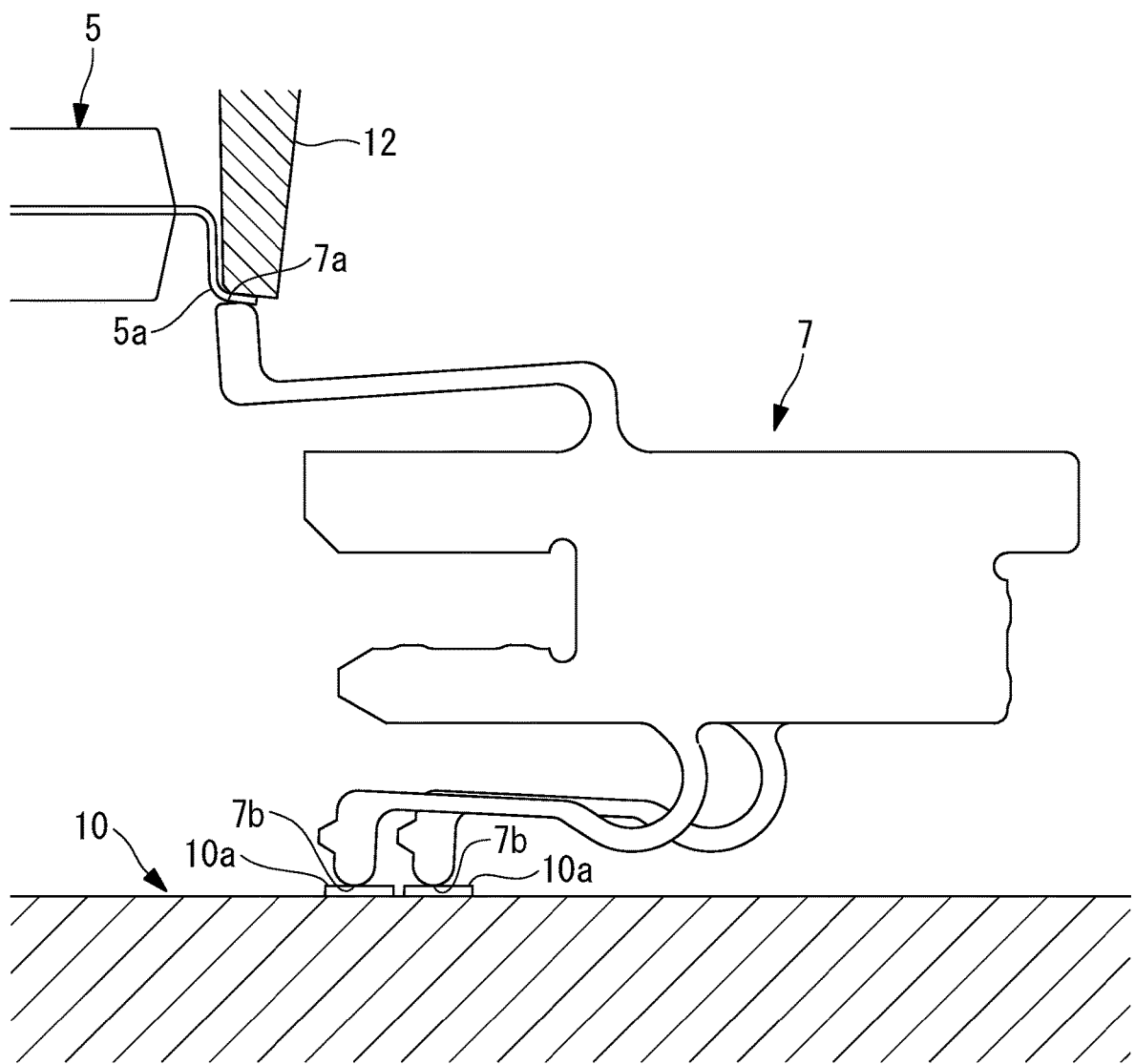
FIG. 8 is a front view illustrating a state where an electrode terminal of the IC device is pushed against the contact by a pusher.

FIG. 8 illustrates a state where the IC device 5 is received in the receiving recess 2a (see FIG. 1), the electrode terminal 5a is set above the first contact 7A of the contact 7, and the electrode terminal 5a is then further pushed downward by a pusher 12. In this state, the IC device 5 and the electrode pads 10a on the substrate for inspection 10 are conducted to each other by the contact 7, and Kelvin inspection of the IC device 5 is performed.

Figure 9:
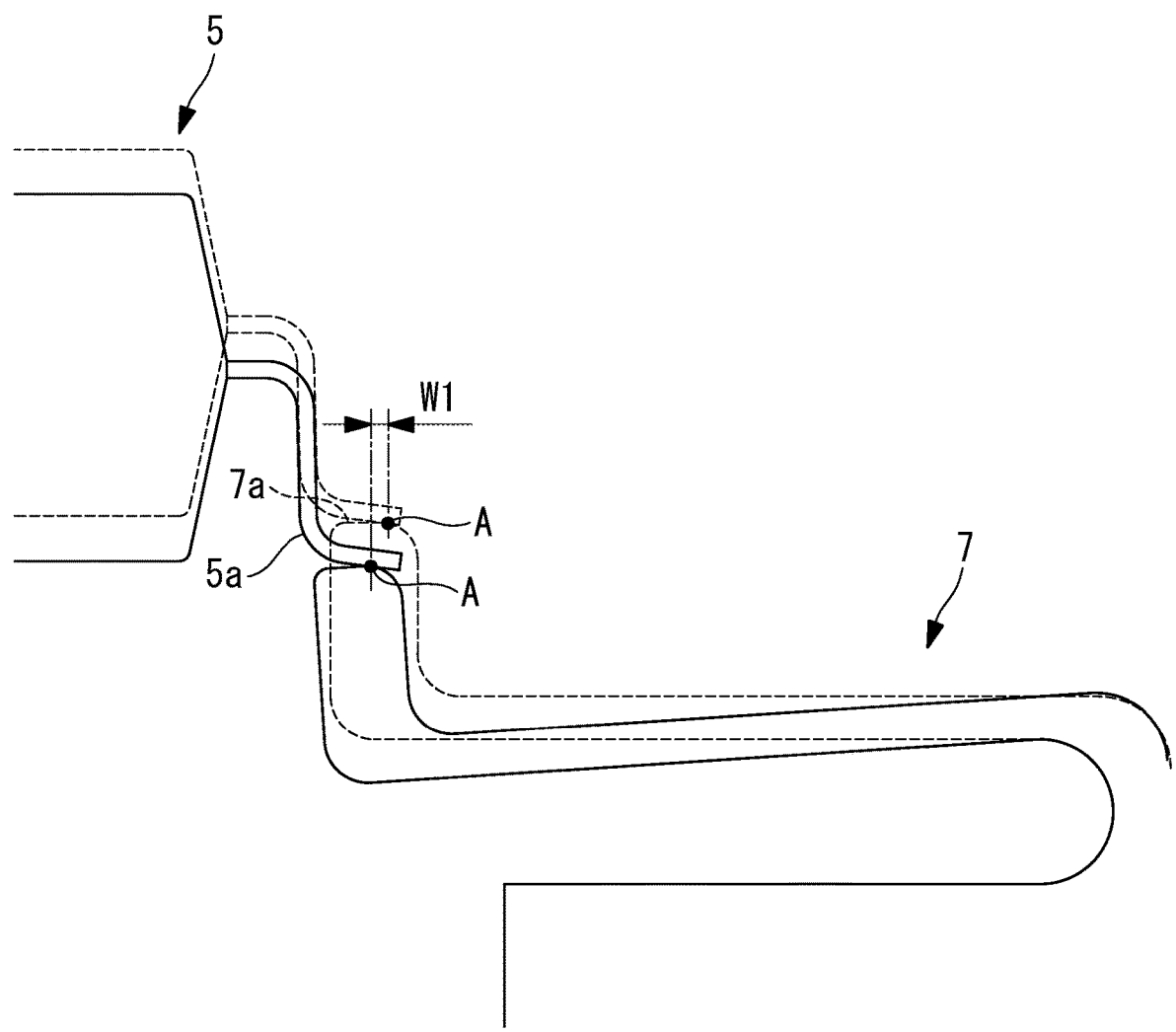
FIG. 9 is a front view illustrating wiping states.

FIG. 9 illustrates a set position (dashed line) in which the electrode terminal 5a is set in contact with the first contact 7A of the contact 7 and an inspection position (solid line) in which the electrode terminal 5a is further pushed downward from the set position to perform inspection. As can be seen from FIG. 9, during transition from the set position to the inspection position, the position (point A) at which the first contact 7A and the electrode terminal 5a are in contact with each other slides, and wiping is performed over a dimension W1. With such wiping, a foreign material is removed or solder transfer is suppressed in a contact range.

Figure 10A:
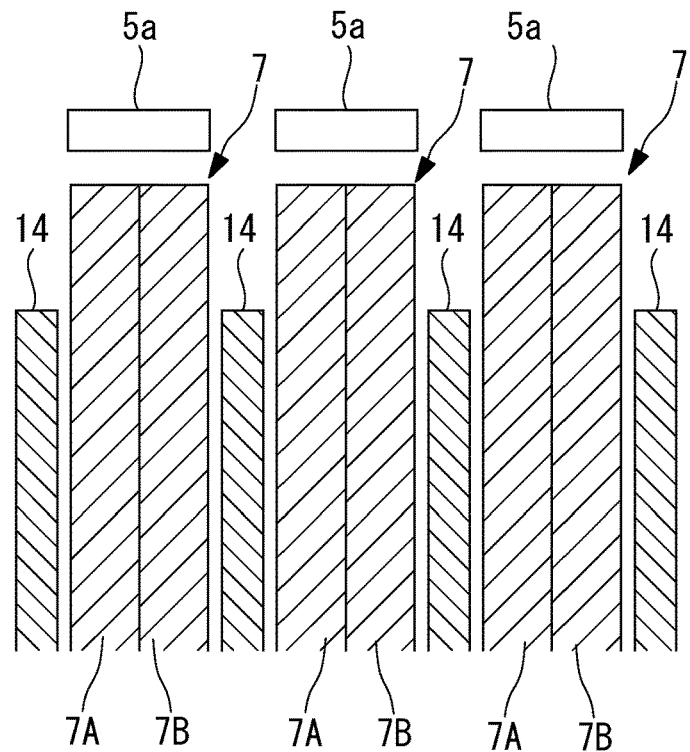
FIG. 10A is a vertical sectional view illustrating a state where partition plates are installed between a plurality of pairs of contacts.

FIG. 10A illustrates a plurality of pairs of contacts 7. Two contacts 7A and 7B are paired, and the contacts 7 of each pair correspond to one electrode terminal 5a of the IC device 5. Note that illustration of the insulating layer 7k (see FIG. 7A) is omitted in FIG. 10A. Respective pairs of the contacts 7 are arranged in association with respective positions of a plurality of electrode terminals 5a arranged in parallel along one side of the IC device 5. Partition plates 14 are provided between respective adjacent pairs of contacts 7. Each partition plate 14 is provided so as to cover the entire range of the contact 7 (except for the upper contact point area and the lower contact point area) when the contact 7 is viewed in plan view as illustrated in FIG. 5 (not illustrated). The partition plate 14 is insulating, and a resin is used, for example. Although not illustrated, each partition plate 14 is fixed to the base 2 of the IC socket 1.

Figure 10B:
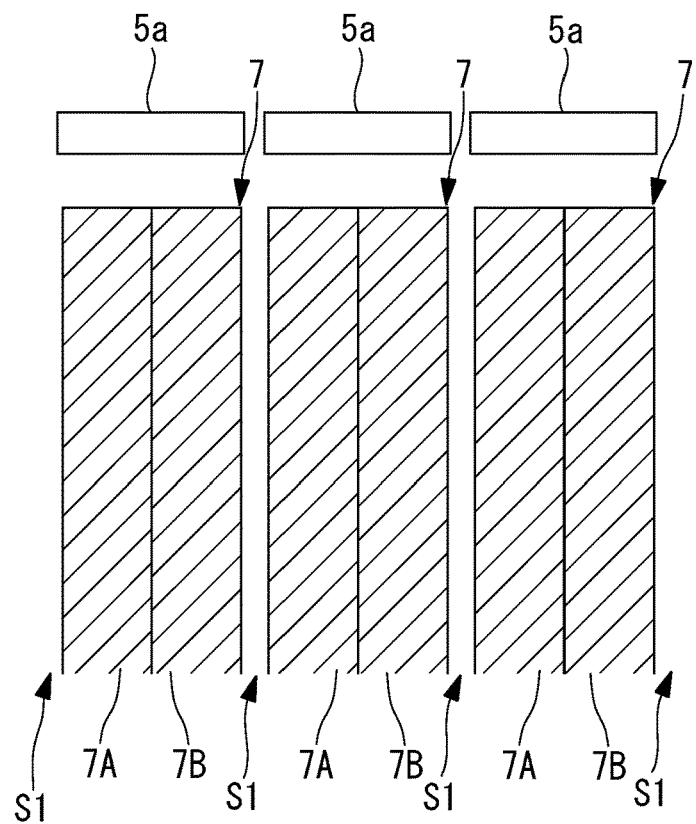
FIG. 10B is a vertical sectional view illustrating a state where spaces are provided between a plurality of pairs of contacts.

As illustrated in FIG. 10B, the partition plate 14 may be omitted when spaces S1 can be provided between respective adjacent pairs of contacts 7 to ensure insulation.

Next, a method of manufacturing the contacts 7 will be described.

Figure 11:
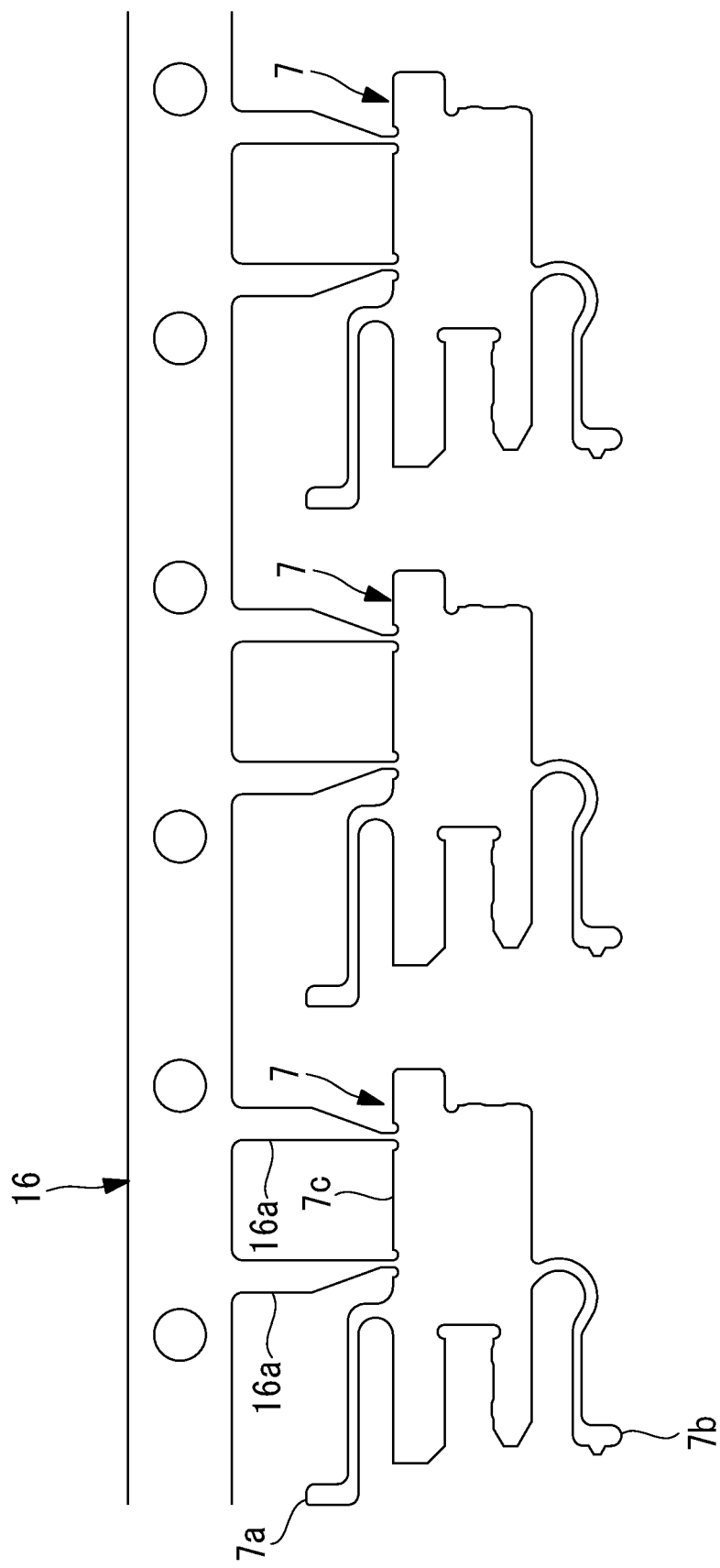
FIG. 11 is a front view illustrating a state where a base material form including contacts has been cut out from a plate material.

As illustrated in FIG. 11, first, a metal plate is cut by wire cutting or the like to obtain an initial form of a plurality of continuous contacts 7. The material of the base material (for example, reference 7i of FIG. 7A) is beryllium copper, for example, and the thickness of the base material is greater than or equal to 100 μm and less than or equal to 500 μm, for example. The initial form illustrated in FIG. 11 has a shape in which the plurality of contacts 7 are continuously connected to a belt-shaped retainer 16. The retainer 16 has connecting arms 16a extending downward. A plurality of connecting arms 16a are provided in parallel along the longitudinal direction of the belt-shaped retainer 16. The lower end of each connecting arm 16a and the upper edge of the intermediate part 7c of each contact 7 are connected to each other. Two connecting arms 16a are connected to each contact 7 so that the contact 7 can be stably hung by the connecting arm 16a.

Plating of gold or the like having good conductivity is then applied to the entire surface in the initial form illustrated in FIG. 11 to obtain a plating layer (for example, reference 7j of FIG. 7A). The thickness of the plating layer is greater than or equal to 2 μm and less than or equal to 5 μm, for example.

Figure 12A:
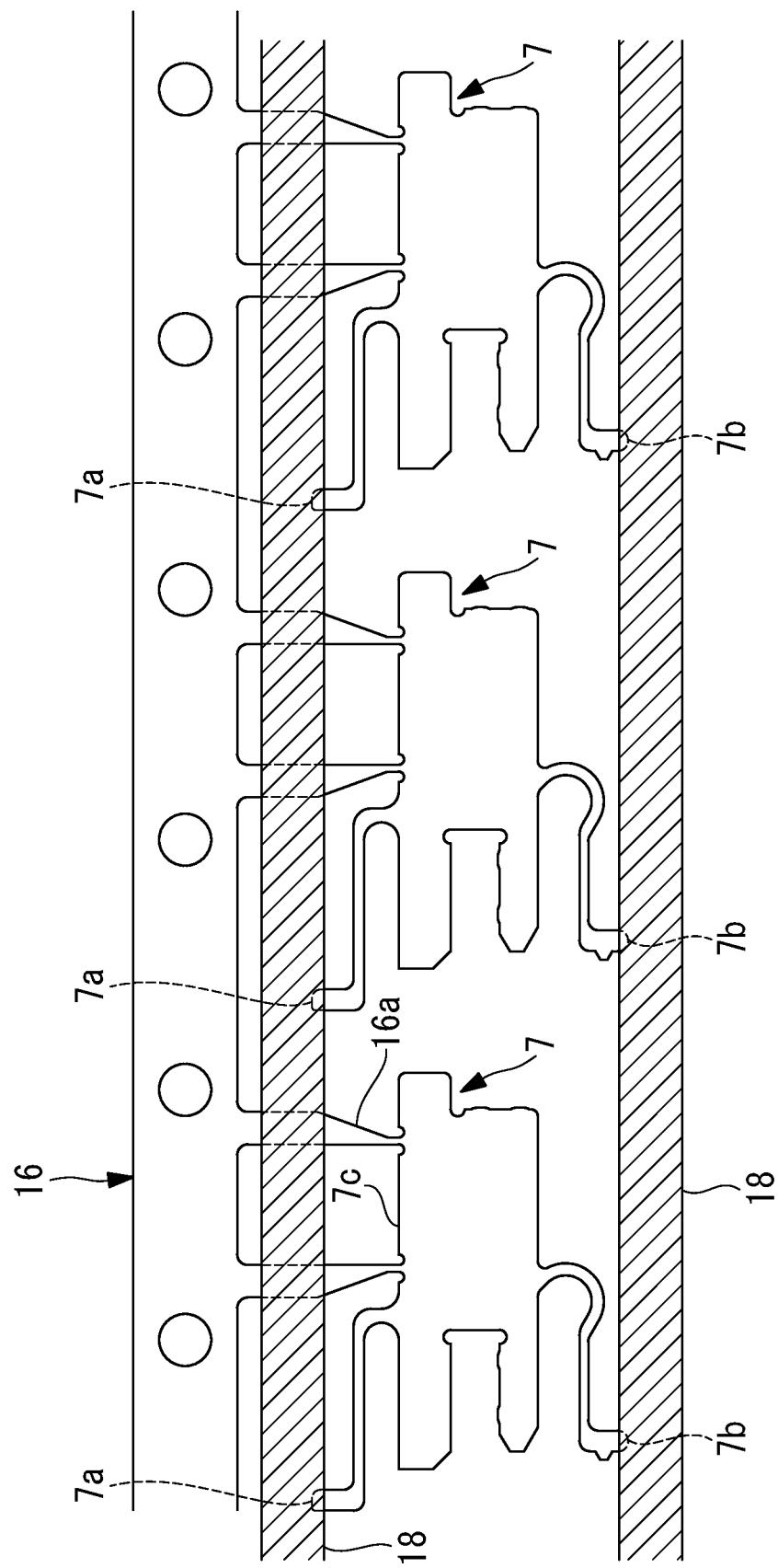
FIG. 12A is a front view illustrating a state where a masking material is applied to the base material form of FIG. 11.
Figure 12B:
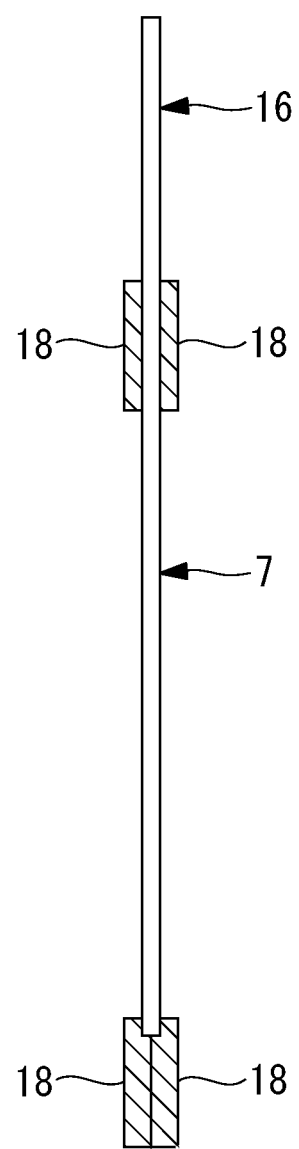
FIG. 12B is a side sectional view of FIG. 12A.

Then, as illustrated in FIG. 12A, tape-like masking materials 18 are attached so as to cover the upper contact point area including the upper contact point 7a and the lower contact point area including the lower contact point 7b of the contact 7. As illustrated in FIG. 12B, the masking materials 18 are provided on both the front and back surfaces of the contact 7, respectively. The insulating layer (for example, reference 7k of FIG. 7A) is formed with the masking materials 18 being attached in such a way. For example, when polyimide is used as the insulating layer, electrode-position coating is used. By applying the masking materials 18 in such a way, it is possible to form the insulating layer over the entire area except for the upper contact point area including the upper contact point 7a and the lower contact point area including the lower contact point 7b.

A plurality of contacts 7 can then be obtained by cutting the connection positions between the lower ends of respective connecting arms 16a and the upper edges of intermediate parts 7c of respective contacts 7 by using laser or the like.

Next, a method of replacing the contact 7 will be described.

As illustrated with respect to FIG. 6, the base 2 of the IC socket 1 has the fitting block 2c fitted into the contact 7, the inner wall block 2f that supports the fitting block 2c from the bottom side, the latching block 2e that latches the protrusion 7e of the contact 7, and the engagement block 2d that supports the latching block 2e from the bottom side. The contact 7 is fixed by the fitting block 2c, the engagement block 2d, and the latching block 2e.

Figure 13:
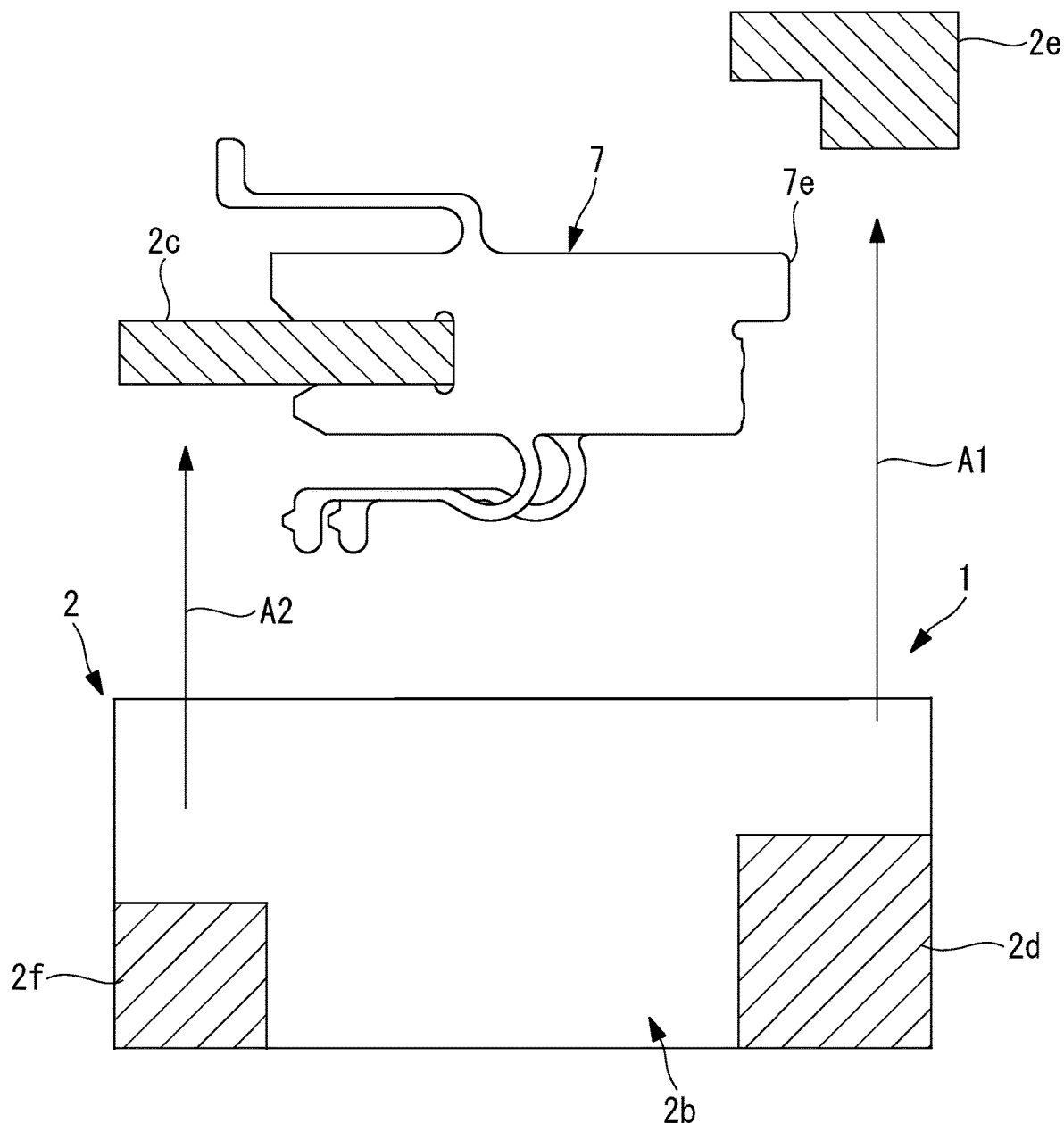
FIG. 13 is a vertical sectional view illustrating a method of replacing the contact.

As illustrated in FIG. 13, the fitting block 2c can be detached from the inner wall block 2f, and the latching block 2e can be detached from the engagement block 2d.

When the contact 7 is removed, first, the latching block 2e is detached from the engagement block 2d and moved upward (arrow A1). The fitting block 2c is then detached from the inner wall block 2f and moved upward (arrow A2) with the fitting block 2c left fitted into the plurality of contacts 7. Accordingly, a plurality of contacts 7 can be removed together at once with a plurality of continuous contacts 7 being fitted to the fitting block 2c.

A plurality of new contacts 7 are then fitted to the fitting block 2c and attached to the base 2 of the IC socket 1. In such a way, the contacts 7 can be easily replaced.

Effects and advantages of the present embodiment described above are as follows.

The insulating layer 7k is provided so as to surround the entire main body area except for the upper contact point area including the upper contact point 7a and the lower contact point area including the lower contact point 7b of the contact 7. Since the insulating layer 7k is provided so as to surround the area mentioned above, the insulating layer 7k and the contacts 7 surrounded by the insulating layer 7k are less likely to be shifted relative to each other. Therefore, even if two adjacent contacts 7 are shifted relative to each other when the contacts 7 are displaced, since the contacts 7 and the insulating layer 7k are less likely to be shifted from each other, the insulating layer 7k is ensured to be located between two contacts 7, and it can be avoided that the two contacts come into electrical contact with each other beyond the insulating layer 7k.

As illustrated in FIG. 10A, by providing the insulating partition plate 14 between adjacent pairs of contacts 7, it is possible to ensure insulation between the adjacent contacts 7.

Note that the partition plate 14 may be omitted, and insulation can also be ensured by the space S1 (see FIG. 10B).

As illustrated in FIG. 13, the fitting block 2c and the latching block 2e are removable, and thereby the contacts 7 are replaceable. Accordingly, if a failure occurs in the contact 7, it is possible to continue inspection by replacing only the contact 7 without replacing the whole IC socket 1.

The embodiment described above can be modified as follows.

Modified Example 1

Figure 14:
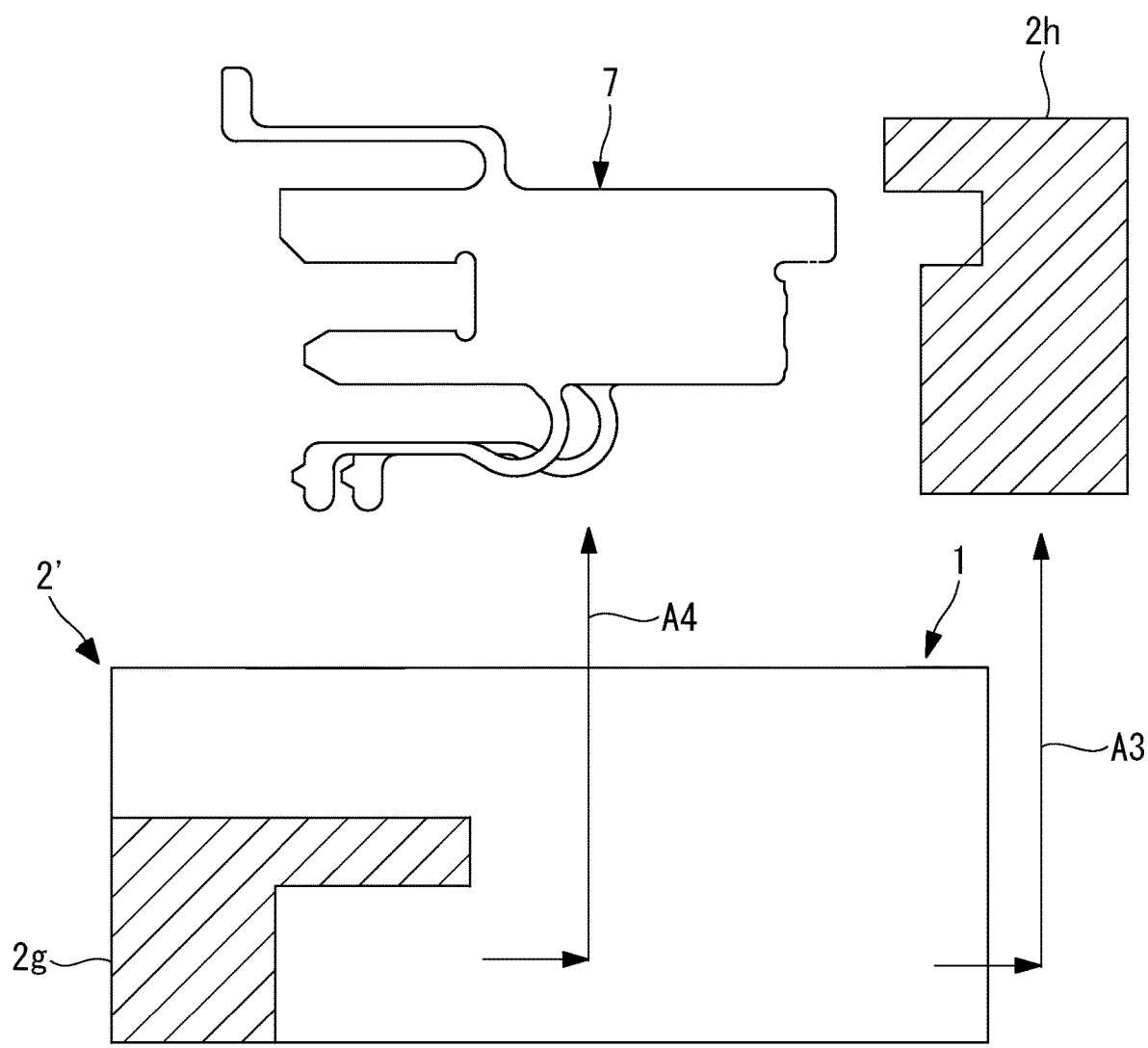
FIG. 14 is a vertical sectional view illustrating a modified example of FIG. 13.

Instead of the method of replacing the contact 7 illustrated in FIG. 13, it is possible to replace the contact 7, as illustrated in FIG. 14.

A base 2' of the IC socket 1 illustrated in FIG. 14 has an inner wall fitting block 2g formed of an integrated block of the fitting block 2c and the inner wall block 2f of FIG. 13. The inner wall fitting block 2g is left fixed on the base 2 side and is not removable. Further, the base 2' of FIG. 14 has a latching engagement block 2h formed of an integrated block of the latching block 2e and the engagement block 2d of FIG. 13. The latching engagement block 2h is removable from the base 2.

When the contact 7 is removed, first, the latching engagement block 2h is slid to the side direction (to the right in FIG. 14) and then moved upward (see the arrow A3). Then, the contact 7 is slid to the side direction (to the right in FIG. 14) and then moved upward (see the arrow A4).

When a new contact 7 is attached, the process is the reverse of the removal, and first, the contact 7 is attached to the inner wall fitting block 2g and then fixed to the latching engagement block 2h. In the modified example illustrated in FIG. 14, it is possible to replace the contacts 7 one by one instead of replacing the fitting block 2c and the plurality of contacts 7 together as illustrated in FIG. 13.

Modified Example 2

In the embodiment described above, the masking materials 18 are used to form the upper contact point area including the upper contact point 7a and the lower contact point area including the lower contact point 7b, as illustrated FIG. 12A and FIG. 12B. In contrast, in the modified example illustrated in FIG. 15A and FIG. 15B, respective contact point areas can be formed without the use of the masking material 18.

Figure 15A:
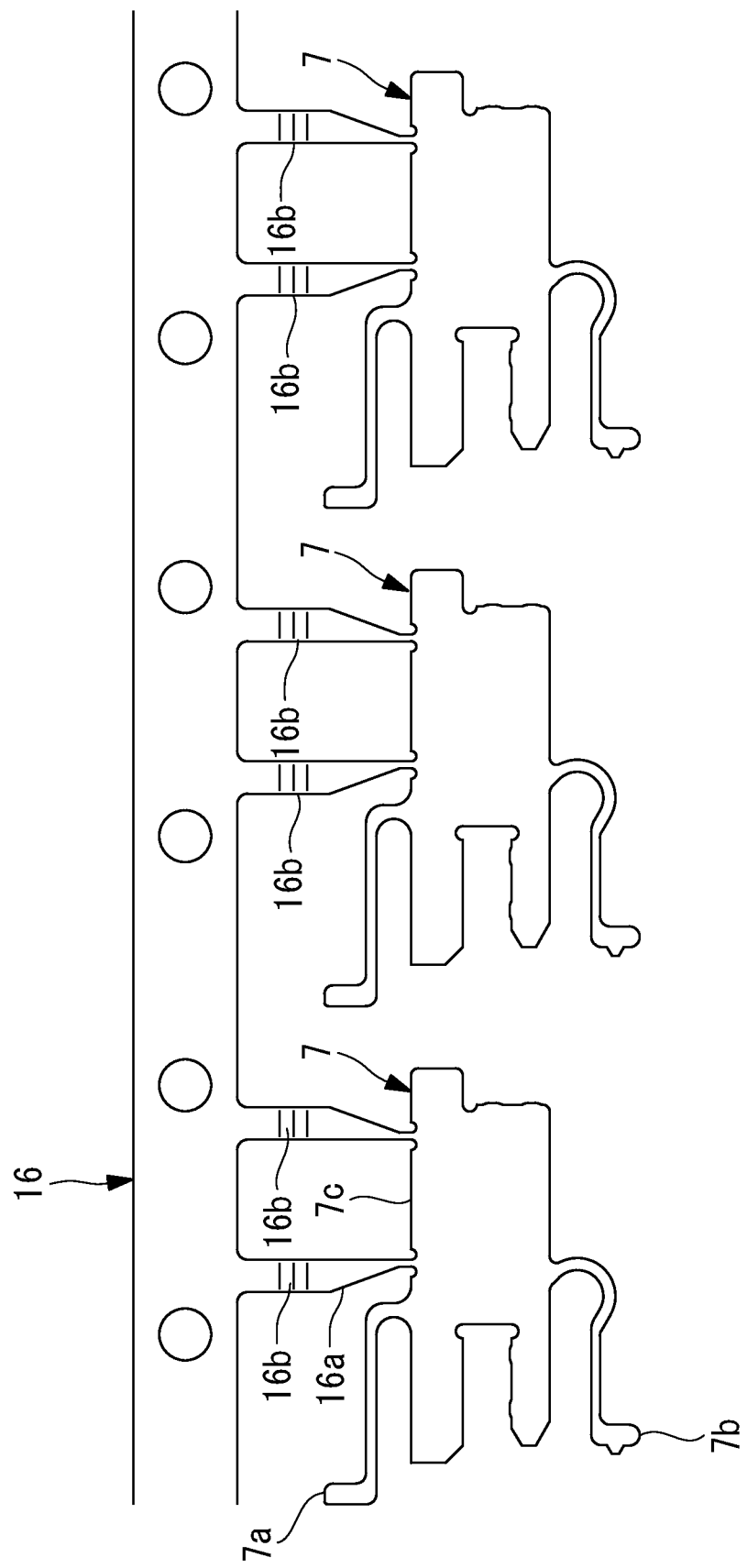
FIG. 15A is a front view illustrating a modified example of FIG. 12A.
Figure 15B:
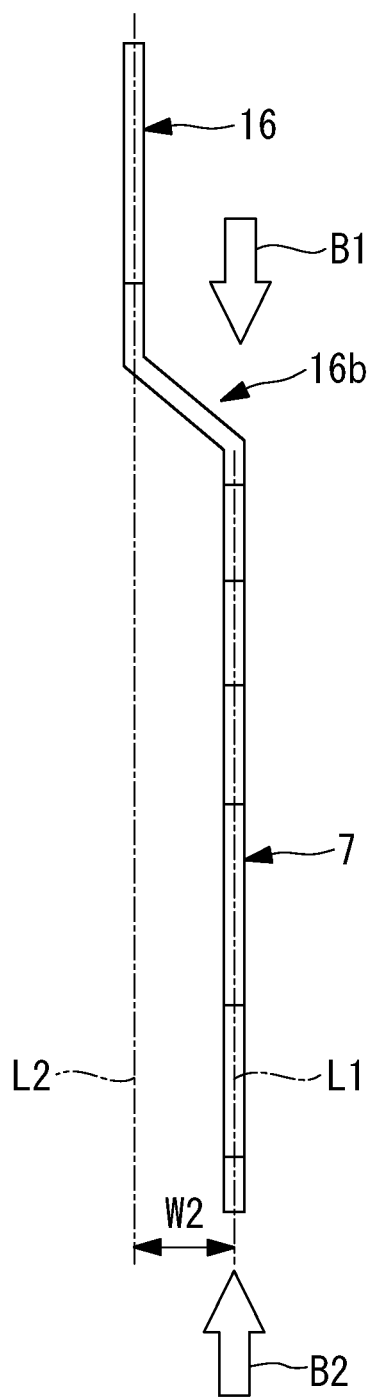
FIG. 15B is a side sectional view of FIG. 15A.

Although the base material has a planar plate-like shape in the embodiment described above as illustrated in FIG. 12B, a bending section 16b is provided in the connecting arm 16a in the present modified example as illustrated in FIG. 15A. As illustrated in FIG. 15B, the bending section 16b is provided to the intermediate position of the connecting arm 16a and has a shape bent in an angle range less than 90 degrees in the plate thickness direction and further bent back to be parallel to the retainer 16. With the bending section 16b, the axial line L1 in the vertical direction of the contact 7 can be offset by a dimension W2 from the axial line L2 in the vertical direction of the retainer 16 parallel to the axial line L1. By offsetting the contact 7 from the retainer 16 in such a way, it is possible to irradiate a position corresponding to an insulating layer (polyimide layer) of the upper contact point area including the upper contact point 7a with laser from the axial line L1 direction (see the arrow B1) without interference with the retainer 16. The insulating layer (polyimide layer) covered on the upper contact point area is partially removed by laser. The insulating layer (polyimide layer) of the lower contact point area including the lower contact point 7b is partially removed by laser emitted from the bottom side (see the arrow B2).

Modified Example 3

Figure 16:
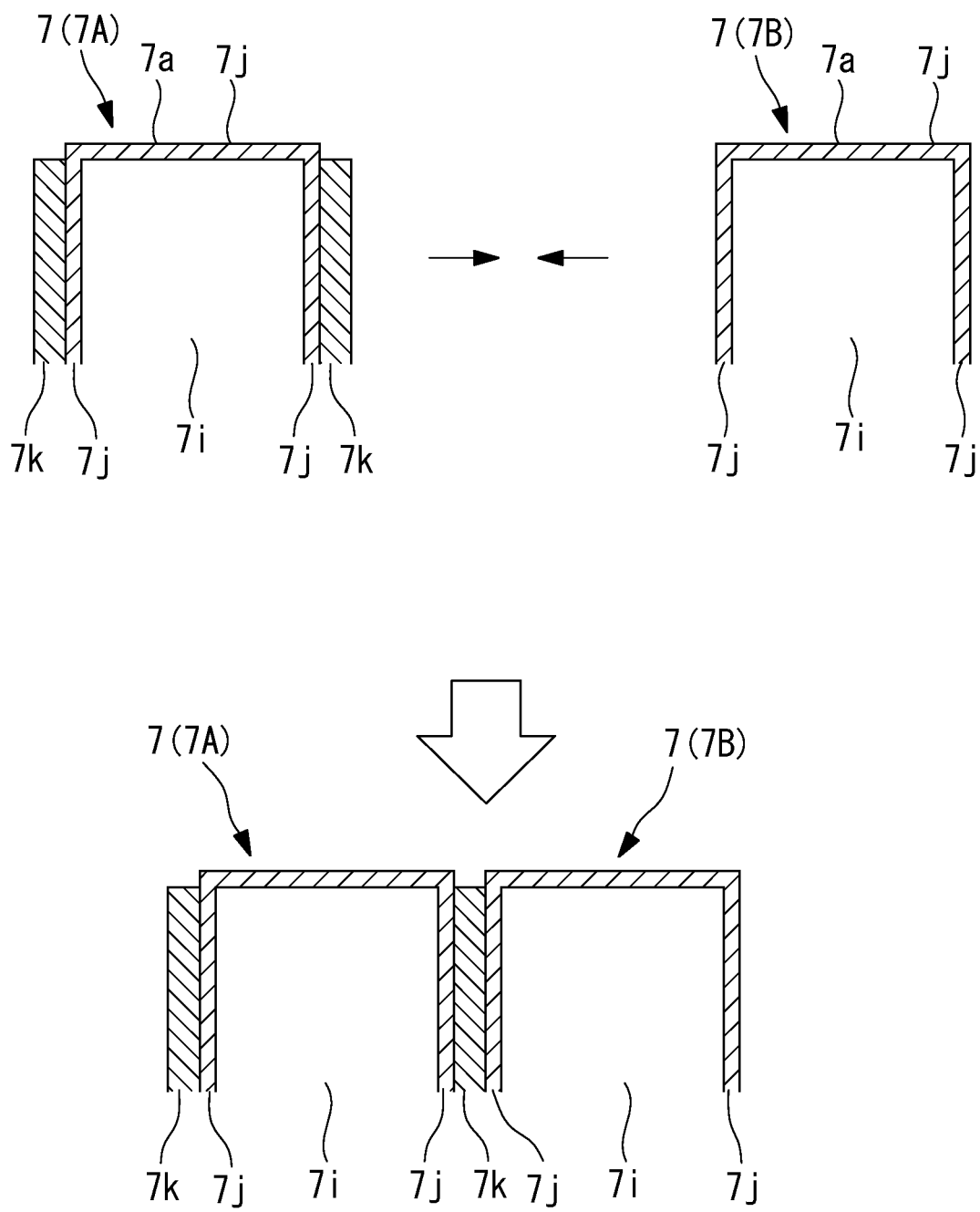
FIG. 16 is a partial enlarged vertical sectional view illustrating a modified example of FIG. 7A.

In the embodiment described above, the insulating layer 7k is provided to each contact 7, as illustrated in FIG. 7A and FIG. 7B. In contrast, as illustrated in FIG. 16, the insulating layer 7k may be formed only on the first contact 7A, and the plating layer 7j may be exposed on the entire surface of the second contact 7B without formation of the insulating layer 7k. Even when the first contact 7A and the second contact 7B are overlapped with each other, electrical insulation can be obtained between both the contacts 7A and 7B because the insulating layer 7k is formed on the first contact 7A. That is, a configuration such that only one of the contacts is provided with the insulating layer may be employed.

Modified Example 4

Figure 17:
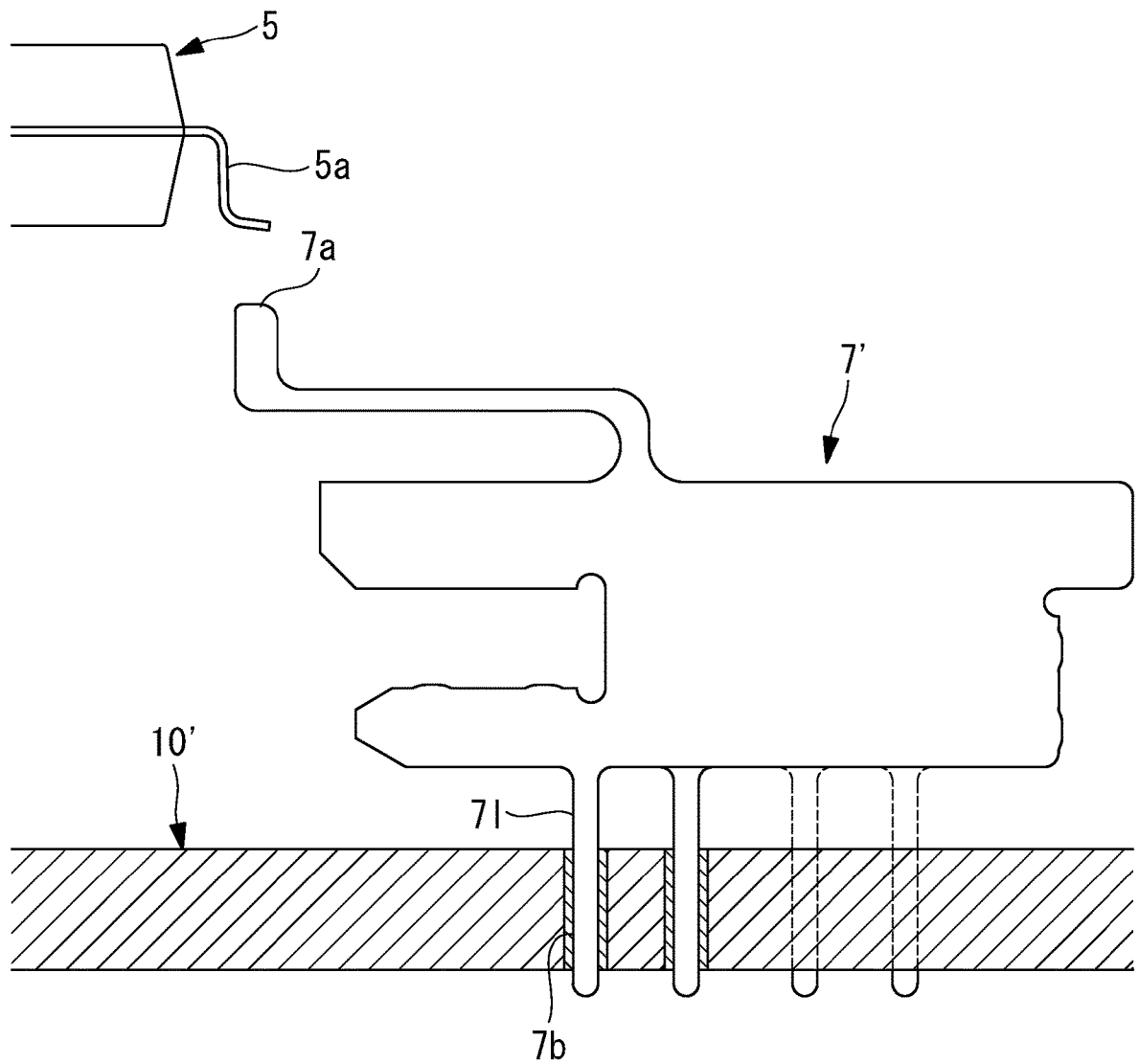
FIG. 17 is a front view illustrating a modified example of the shape of a contact.

The embodiment described above has been described with the contact 7 having the shape corresponding to the substrate for inspection 10 for a surface-mounting type as illustrated in FIG. 2, for example. In contrast, as illustrated in FIG. 17, a contact 7' having a shape corresponding to a substrate for inspection 10' for a DIP type may be used. The contact 7' has lower terminals 7l extending straight perpendicularly downward. Each lower terminal 7l is inserted through a through hole formed in the substrate for inspection 10' and thereby used as the lower contact point 7b. Therefore, the insulating layer (for example, see reference 7k of FIG. 7B) is removed from the area serving as the lower contact point 7b, that is, the side surface of the lower terminal 7l. As illustrated in FIG. 17, four lower terminals 7l are provided. The number of lower contact points 7b may be two as illustrated with reference to FIG. 2 in the embodiment described above or may be three or greater as with the present modified example.

Further, although not illustrated, a contact that moves mainly vertically with a smaller wiping amount than the contact 7 of FIG. 9 or a contact that moves only vertically with substantially no wiping may be employed without being limited to the contact 7 that provides positive wiping as illustrated in FIG. 9.

REFERENCE SYMBOLS

1 IC socket (Kelvin socket for inspection)
2, 2' base
2a receiving recess
2b contact housing
2c fitting block
2d engagement block
2e latching block
2f inner wall block
2g inner wall fitting block
2h latching engagement block
3 cover
5 IC device (electronic component)
5a electrode terminal
7, 7' contact
7A first contact
7B second contact
7a upper contact point (one end)
7b lower contact point (the other end)
7c intermediate part
7d groove
7e protrusion
7f recess
7g upper lever
7g1 base end
7g2 arm section
7g3 tip
7h lower lever
7h1 arc section
7h2 arm section
7h3 tip
7i base material
7j plating layer
7k insulating layer
7l lower terminal
9 hinge
10, 10' substrate for inspection
10a electrode pad (substrate electrode)
12 pusher
14 partition plate
16 retainer
16a connecting arm
16b bending section
18 masking material
S1 space While example embodiments have been particularly shown and described, it will be understood by those skilled in the art that various changes in form and details may be made therein without departing from the scope of the embodiments encompassed by the appended claims.

What is claimed is:

1. A Kelvin contact for inspection comprising:
a first contact having one end that comes into contact with one electrode terminal of an electronic component and the other end that comes into contact with a substrate electrode of a substrate for inspection; and
a second contact having one end that comes into contact with the one electrode terminal and the other end that comes into contact with a substrate electrode of the substrate for inspection,
wherein the first contact and the second contact are arranged adjacent to each other so as to be able to contact with the same one electrode terminal, and
wherein at least one of the first contact and the second contact is provided with an insulating layer surrounding at least a part of a main body area except for one end area including the one end and the other end area including the other end.

2. The Kelvin contact for inspection according to claim 1, wherein the insulating layer is provided over the entire main body area.

3. The Kelvin contact for inspection according to claim 1, wherein the insulating layer is provided on both the first contact and the second contact.

4. A Kelvin socket for inspection comprising:
the Kelvin contact for inspection according to claim 1; and
a contact housing that accommodates the Kelvin contact for inspection.

5. The Kelvin socket for inspection according to claim 4, wherein an insulating partition plate is provided between one pair of contacts formed of the first contact and the second contact and another pair of contacts adjacent to the one pair of contacts.

6. The Kelvin socket for inspection according to claim 4, wherein the first contact and/or the second contact are/is replaceable with respect to the contact housing.

7. A method of manufacturing a Kelvin contact for inspection that comprises
a first contact having one end that comes into contact with one electrode terminal of an electronic component and the other end that comes into contact with a substrate electrode of a substrate for inspection, and
a second contact having one end that comes into contact with the one electrode terminal and the other end that comes into contact with a substrate electrode of the substrate for inspection,
wherein the first contact and the second contact are arranged adjacent to each other so as to be able to contact with the same one electrode terminal, and
wherein at least one of the first contact and the second contact is provided with an insulating layer surrounding at least a part of a main body area except for one end area including the one end and the other end area including the other end,
the method comprising:
after masking the one end area and the other end area of the first contact and/or the second contact, forming the insulating layer on the first contact and/or the second contact.

8. A method of manufacturing a Kelvin contact for inspection that comprises
a first contact having one end that comes into contact with one electrode terminal of an electronic component and the other end that comes into contact with a substrate electrode of a substrate for inspection, and
a second contact having one end that comes into contact with the one electrode terminal and the other end that comes into contact with a substrate electrode of the substrate for inspection,
wherein the first contact and the second contact are arranged adjacent to each other so as to be able to contact with the same one electrode terminal, and
wherein at least one of the first contact and the second contact is provided with an insulating layer surrounding at least a part of a main body area except for one end area including the one end and the other end area including the other end, the method comprising:

after forming the insulating layer over the entirety of the first contact and/or the second contact, removing the insulating layer formed on the one end area and the other end area of the first contact and/or the second contact by using laser.

\* \* \* \* \*